United States Patent
Hung et al.

(10) Patent No.: US 8,692,580 B2
(45) Date of Patent: Apr. 8, 2014

(54) SENSE AMPLIFIER (75) Inventors: Chen-Ming Hung, Zhubei (TW);
Sung-Chieh Lin, Zhubei (TW);
Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 206 days.

(21) Appl. No.: 13/407,548

(22) Filed: Feb. 28, 2012

(65) Prior Publication Data
US 2013/0221995 A1   Aug. 29, 2013

(51) Int. Cl.
*H03K 3/00* (2006.01)

(52) U.S. Cl.
USPC .............................. 327/51; 330/253; 324/705

(58) Field of Classification Search
USPC ........ 327/51–53, 57, 159, 538; 330/296, 253,
330/254, 257, 361; 324/705, 76.11
See application file for complete search history.

(56) References Cited

U.S. PATENT DOCUMENTS

| | | | |
|---|---|---|---|
| 6,967,532 B2 * | 11/2005 | Tan ................................ 330/253 |
| 2004/0051564 A1 * | 3/2004 | Bedarida et al. ................ 327/51 |
| 2008/0169843 A1 * | 7/2008 | Aipperspach et al. .......... 327/51 |

* cited by examiner

*Primary Examiner* — Lincoln Donovan
*Assistant Examiner* — Diana J Cheng
(74) *Attorney, Agent, or Firm* — Lowe Hauptman & Ham, LLP (57) ABSTRACT

An amplifying circuit comprises a bias circuit, a reference circuit, a first circuit, and an amplifying sub-circuit. The bias circuit is configured to provide a bias current. The reference circuit is configured to provide a first differential input based on a reference resistive device and a reference current derived from the bias current. The first circuit is configured to provide a second differential input based on a first current and a first resistance. The amplifying sub-circuit is configured to receive the first differential input and the second differential input and to generate a sense amplifying output indicative of a resistance relationship between the first resistance and a resistance of the reference resistive device.

21 Claims, 4 Drawing Sheets

SENSE AMPLIFIER

FIELD

The present disclosure is related to a sense amplifier.

BACKGROUND

In some approaches, an output of a sense amplifier indicates a logical state of an electrical fuse (eFuse). For example, if the resistance of the eFuse is higher than the resistance of a reference resistor, the output of the sense amplifier is logically high. The eFuse is said to be open and have a high logical value. But if the resistance of the eFuse is lower than the resistance of the reference resistor, the output of the sense amplifier is logically low. The eFuse is said to be closed and have a low logical value. A trip point of the sense amplifier is the point when the output of the sense amplifier changes the logical state, such as from a high logical value to a low logical value or vice versa. In an existing approach, a sense amplifier has a wide statistical distribution of the trip points, which results from a smaller gain and a smaller sensing current of the sense amplifier. The statistical distribution of the trip points of the sense amplifier also varies in response to variations of the manufacturing process.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The sense amplifier has a high sensing current, which is adjustable by adjusting resistance of a bias resistor. The sense amplifier has a high amplifying gain. The process variation is compensated by the differential input structure in the amplifying stage of the sense amplifier.

Exemplary Sense Amplifier Circuit

Figure 1:
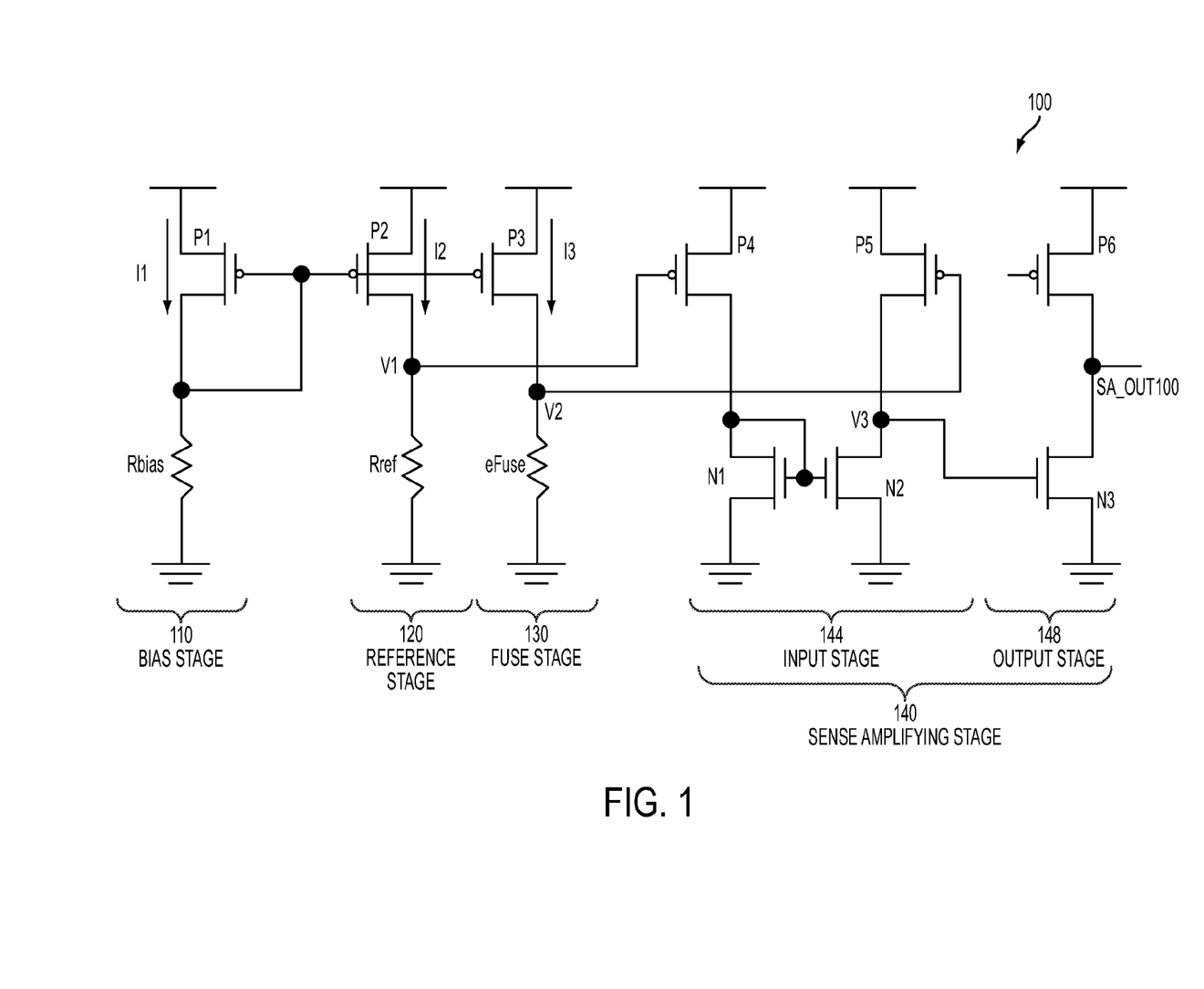
FIG. 1 is a diagram of a sense amplifier circuit, in accordance with some embodiments.

FIG. 1 is a diagram of a sense amplifier circuit 100, in accordance with some embodiments.

A P-type metal oxide semiconductor (PMOS) transistor P1 and a bias resistor Rbias form a bias stage 110 for sense amplifier circuit 100. Resistor Rbias is used to select the desired current I1 that flows through the source and the drain of PMOS transistor P1 and through resistor Rbias. The resistance value of resistor Rbias is inversely proportional to the current value of current I1, and is thus inversely proportional to the current value of current I2 and the voltage value of voltage V1 at the drain of a PMOS transistor P2. Voltage V1 at the gate of a PMOS transistor P4 affects the conduction state of PMOS transistor P4. In some embodiments, the resistance of resistor Rbias is selected such that, when PMOS transistor P4 is supposed to be on, an absolute value of voltage V1 is greater than an absolute value of the threshold voltage of transistor P4. As a result, transistor P4 is turned on or conducting.

PMOS transistor P2 and a reference resistor Rref form a reference stage 120. The resistance of resistor Rref is compared with the resistance of fuse eFuse to determine the logical value and thus the program status of fuse eFuse. For example, when fuse eFuse has been programmed, the resistance of fuse eFuse is higher than the resistance of resistor Rref. But when fuse eFuse has not been programmed, the resistance of fuse eFuse is lower than the resistance of resistor Rref. Because current I2 is equal to current I1 through the current mirror formed by transistors P1 and P2, current I1 and thus current I2 are selected independent of the resistance of resistor Rref. In other words, the resistance of resistor Rref is selected independent of current I1 and current I2. In some embodiments, the resistance of resistor Rref is 1 KΩ in a normal mode and is 4 KΩ in a margin mode. In some embodiments, the margin mode is used to confirm the resistance of fuse eFuse after fuse eFuse is programmed. For example, if after being programmed, the resistance of fuse eFuse is less than 4 KΩ, fuse eFuse is considered defective.

Current I1 flows between the source and the drain of PMOS transistor P1. Current I2 flows between the source and the drain of PMOS transistor P2. The gates of transistors P1 and P2 are coupled together and to the drain of transistor P1. As a result, transistors P1 and P2 form a current mirror. Effectively, for a given value of current I1, transistor P2 provides a current I2 having a value equal to the current value of current I1, regardless of the resistance value of resistor Rref. Current I2 also flows through reference resistor Rref. As a result, current I2 is also called a reference current. Changing the resistance of resistor Rbias changes the current value of current I1, resulting in changing reference current I2. Explained in another way, reference current I2 is controlled by adjusting the resistance of resistor Rbias. A change in current I2 flowing through resistor Rref also causes a change in voltage V1 at one end of resistor Rref. PMOS transistors P1 and P2 forming a current mirror are used for illustration. Other types of transistors and/or other circuits providing current I2 from current I1 are within the scope of various embodiments.

For illustration, voltage VDP1 represents the voltage at the drain of transistor P1. Voltage VGP1 represents the voltage at the gate of transistor P1. Voltage VDSP1 represents the voltage dropped across the drain and the source of transistor P1. Voltage VGSP1 represents the voltage dropped across the gate and the source of transistor P1. In the embodiments of FIG. 1, because the gate and the drain of transistor P1 are coupled together, voltage VDSP1 is equal to voltage VGSP1.

Further, $$VGSP1 = VGP1 - VDD \quad (1)$$
$$= (I1 * Rbias) - VDD \quad (2)$$
$$VDP1 = I1 * Rbias = VGP1 \quad (3)$$
$$V1 = I2 * Rref \quad (4)$$
$$I1 = I2 \quad (5)$$

In some embodiments, current I1 is selected based on the current-voltage (I-V) curve of transistor P1 at the point where VGSP1 equals to VDSP1, and resistor Rbias is selected based on the above equations (1), (2), (3), (4), and (5).

A PMOS transistor P3 and electrical fuse eFuse form a fuse stage 130. Fuse eFuse is considered a resistor. In some embodiments, when fuse eFuse is not programmed, the resistance of fuse eFuse is about 50Ω, and fuse eFuse is considered closed and has a low logical value. After fuse eFuse is programmed, the resistance of fuse eFuse is about 10 KΩ, and fuse eFuse is considered open and has a high logical value. In some embodiments, the logical value of fuse eFuse is determined with reference to the resistance of reference resistor Rref. For example, if the resistance of fuse eFuse is higher than the resistance of resistor Rref, fuse eFuse is considered open and has a logical high value. But if the resistance of fuse eFuse is lower than the resistance of resistor Rref, fuse eFuse is considered closed and has a logical low value. The logical value of fuse eFuse is determined based on a logical value of an output SA_OUT100. For example, when fuse eFuse is logically high, output SA_OUT100 is logically high. In contrast, when fuse eFuse is logically low, output SA_OUT100 is logically low.

The gate of transistor PMOS P3 is coupled to the gate of PMOS transistor P2. PMOS transistor P3 is configured to match PMOS transistor P2 such that current I3 equals to current I2. Current I3 therefore also equals current I1. Current I3 flows between the source and the drain of PMOS transistor P3 and through fuse eFuse. Voltage V2 at one end of fuse eFuse varies depending on current I3 and the resistance of fuse eFuse. When the resistance of resistor Rref and of fuse eFuse are the same, voltages V1 and V2 are the same. But if the resistance of fuse eFuse is higher than the resistance of resistor Rref, voltage V2 is higher than voltage V1. In contrast, when the resistance of fuse eFuse is lower than the resistance of resistor Rref, voltage V2 is less than voltage V1. In various embodiments, current I2 and thus current I3 are selected so that the voltage difference between voltages V1 and V2 are suitable for a sense amplifying stage 140. For example, when sense amplifying stage 140 is able to sense a smaller difference between voltages V1 and V2, currents I2 and I3 are increased to reduce the voltage difference between voltages V1 and V2. But if sense amplifying stage 140 is able to sense a larger difference between voltages V1 and V2, currents I2 and I3 are decreased to increase the voltage difference between voltages V1 and V2. Fuse eFuse is used for illustration. Other devices having a resistance used in place of fuse eFuse are within the scope of various embodiments. PMOS transistors P1, P2, and P3 are used for illustration. Other transistors and/or circuit generating voltages V1 and V2 are within the scope of various embodiments.

Sense amplifying stage 140 includes an input stage 144 and an output stage 148. PMOS transistors P4 and P5, and N-type metal oxide semiconductor (NMOS) transistors N1 and N2 form input stage 144. The drain of PMOS transistor P4 is coupled to the drain and the gate of NMOS transistor N1 and the gate of NMOS transistor N2. The drain of PMOS transistor P5 is coupled to the drain of NMOS transistor N2 and the gate of NMOS transistor N3. The sources of PMOS transistors P4 and P5 are configured to receive operational voltage VDD (not labeled). The sources of NMOS transistors N1 and N2 are configured to receive ground or reference voltage VSS (not labeled). In various embodiments, any variation in manufacture process experienced by PMOS transistor P4 is compensated for by process variations experienced by PMOS transistor P5. As a result, sense amplifying stage 140 and thus circuit 100 are advantageously independent of manufacturing process variations.

A PMOS transistor P6 and an NMOS transistor N3 form output stage 148 for sense amplifying stage 140. The drain of PMOS transistor P6 is coupled to the drain of NMOS transistor N3, and is configured as output SA_OUT100 of sense amplifier circuit 100. The sources of PMOS transistor P6 and NMOS transistor N3 are configured to receive operational voltage VDD and reference voltage VSS, respectively.

Voltages V1 and V2 at the gates of respective transistors P4 and P5 serve as differential inputs for amplifying stage 140. Voltage V1 is also at the drain of PMOS transistor P2 and at one end of reference resistor Rref. Voltage V1 varies depending on the resistance of resistor Rref. Voltage V2 is also at the drain of PMOS transistor P3 and at one end of fuse eFuse. Voltage V2 varies depending on the resistance of fuse eFuse. Based on the voltage difference between voltages V1 and V2, sense amplifying stage 140 provides a logical value for output SA_OUT100, which corresponds to the logical value or the program condition of fuse eFuse. For example, when the resistance of fuse eFuse is higher than the resistance of resistor Rref, voltage V2 is higher than voltage V1. As a result, PMOS transistor P5 is turned off while PMOS transistor P4 is turned on. The current from the on-transistor P4 flows through NMOS transistors N1 and N2. Transistors N1 and N2 are therefore turned on. Voltage V3 at the drain of NMOS transistor N2 is pulled to voltage VSS or ground at the source of NMOS transistor N2. Because voltage V3 at the gate of NMOS transistor N3 is logically low, transistor N3 is turned off. At the same time, PMOS transistor P6 is configured to be on. As a result, output SA_OUT100 at the drain of PMOS transistor P6 is pulled to voltage VDD at the source of transistor P6. Effectively, output SA_OUT100 is logically high.

In contrast, when the resistance of fuse eFuse is less than the resistance of reference resistor Rref, voltage V2 is less than voltage V1. As a result, PMOS transistor P5 is turned on while PMOS transistor P4 is turned off. NMOS transistors N1 and N2 are also turned off. Voltage V3 at the drain of PMOS transistor P5 is pulled to operational voltage VDD at the source of PMOS transistor P5. Because voltage V3 at the gate of NMOS transistor N3 is logically high, transistor N3 is turned on. At the same time, PMOS transistor P6 is configured to be off. As a result, output SA_OUT100 at the drain of NMOS transistor N3 is pulled to voltage VSS or ground at the source of NMOS transistor N3. Effectively, output SA_OUT100 is logically low.

Sense amplifying stage 140 is used for illustration. Other amplifying circuits configured to receive voltages V1 and V2 to generate output SA_OUT100 are within the scope of various embodiments.

In some embodiments, the resistance of fuse eFuse varies after fuse eFuse is programmed. Sense amplifying circuit 100 is used to verify the resistance of fuse eFuse, and thus to verify the program condition of fuse eFuse. For example, at the time of verifying, if the resistance of fuse eFuse continues to be higher than the resistance of reference resistor Rref, fuse eFuse is considered a good electrical fuse. But if, at the time of verifying, the resistance of fuse eFuse is less than the resistance of reference resistor Rref, fuse eFuse is considered defective.

Sense Amplifier Circuit

Other Embodiments

Figure 2:
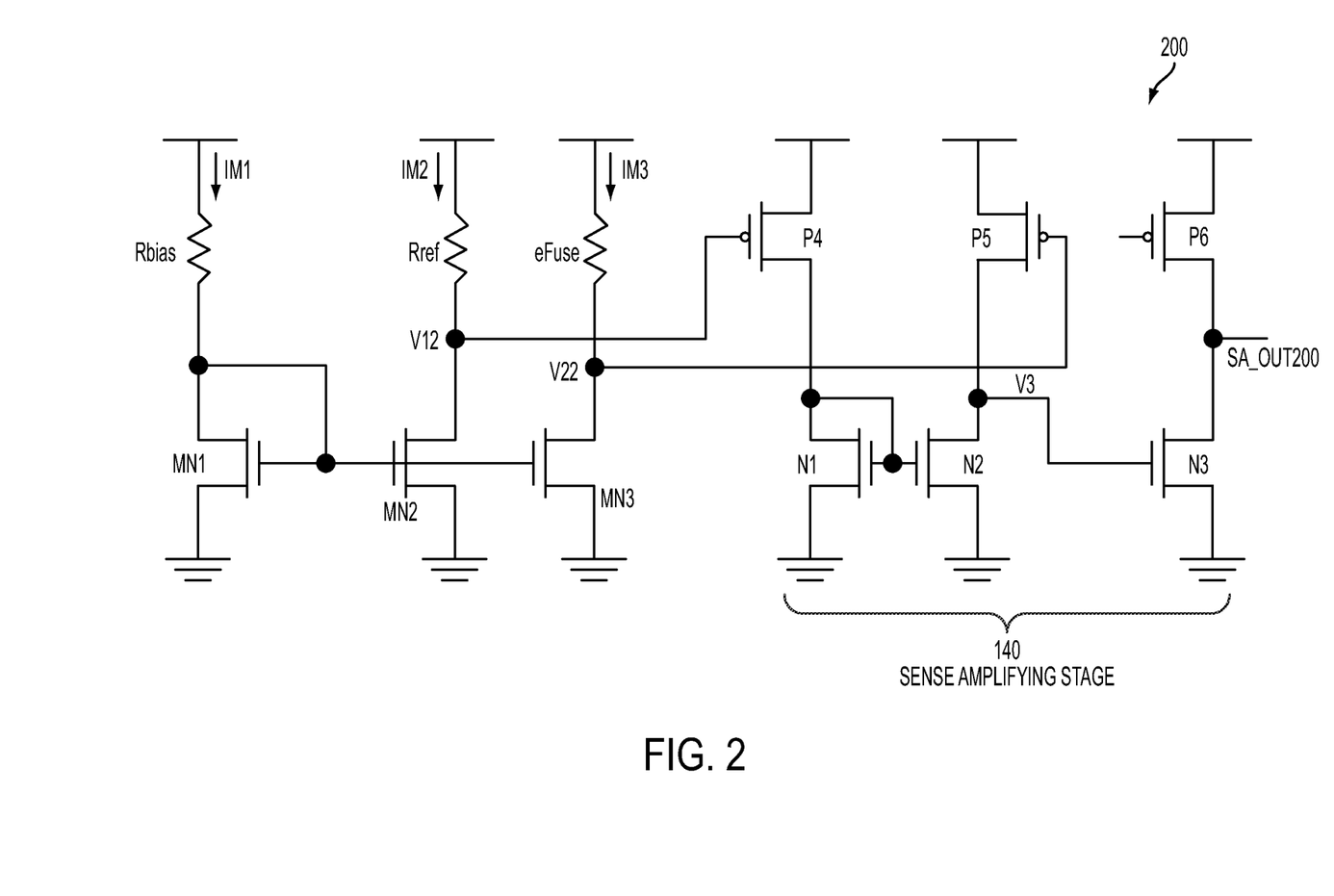
FIG. 2 is a diagram of another sense amplifier circuit, in accordance with some embodiments.

FIG. 2 is diagram of a sense amplifier circuit 200, in accordance with some embodiments.

Compared with circuit 100 in FIG. 1, NMOS transistors MN1, MN2, and MN3 are used in place of PMOS transistors P1, P2, and P3 in circuit 100. As a result, resistors Rbias, Rref, and eFuse are configured differently. The operation of sense amplifying stage 140 is also different.

Currents IM1, IM2, and IM3 correspond to currents I1, I2, and I3 in circuit 100. Current IM1 flows through bias resistor Rbias, the drain, and the source of NMOS transistor MN1. Current IM2 flows through reference resistor Rref, the drain, and the source of NMOS transistor MN2. Current IM3 flows through fuse eFuse, the drain, and the source of NMOS transistor MN3. Voltages V12 and V22 correspond to voltages V1 and V2 in circuit 100, respectively.

When the resistance of fuse eFuse is greater than the resistance of resistor Rref, voltage V22 is less than voltage V12. As a result, sense amplifying stage 140 operates in a manner similar to the situation when voltage V2 is less than voltage V1 in circuit 100. Output SA_OUT200 is therefore logically low. In contrast, when the resistance of fuse eFuse is less than the resistance of resistor Rref, voltage V22 is greater than voltage V12. As a result, sense amplifying stage 140 operates in a manner similar to the situation when voltage V2 is greater than voltage V1 in circuit 100. Output SA_OUT200 is therefore logically high. Effectively, when fuse eFuse is programmed and has a logical high value, output SA_OUT200 is logically low, and, when fuse eFuse is not programmed and has a low logical value, output SA_OUT200 is logically high.

Figure 3:
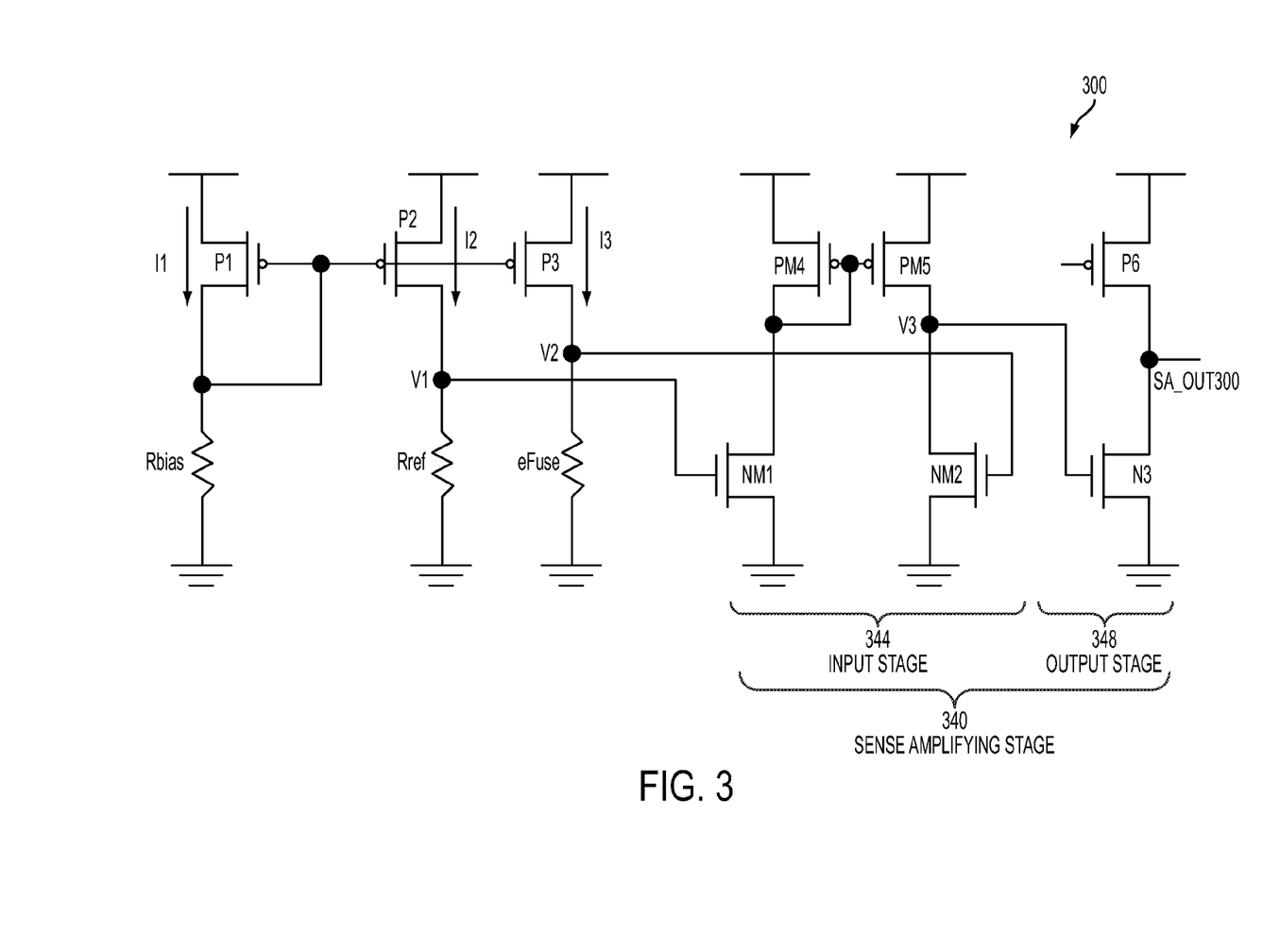
FIG. 3 is a diagram of another sense amplifier circuit, in accordance with some embodiments.

FIG. 3 is a diagram of a sense amplifier circuit 300, in accordance with some embodiments.

Compared with circuit 100 in FIG. 1, a sense amplifying stage 340 is used in place of sense amplifying stage 140 in circuit 100. An output stage 348 of sense amplifying stage 340 that includes PMOS transistor P6 and NMOS transistor N3 is the same as output stage 148 of sense amplifying stage 140 in circuit 100.

An input stage 344 of sense amplifying stage 340 is configured differently from input stage 144 of sense amplifying stage 140 in circuit 100. For example, the configuration of PMOS transistors PM4 and PM5, and NMOS transistors NM1 and NM2 of input stage 344 is different from the configuration of PMOS transistors P4 and P5, and NMOS transistors N1 and N2 of input stage 144 of circuit 100. The gates of PMOS transistors PM4 and PM5 are coupled together and to the drain of PMOS transistor PM4. The gate of NMOS transistor NM1 is configured to receive voltage V1. The gate of NMOS transistor NM2 is configured to receive voltage V2.

When the resistance of fuse eFuse is greater than the resistance of resistor Rref, voltage V2 is greater than voltage V1. As a result, transistor NM2 is turned on and transistor NM1 is turned off. PMOS transistors PM4 and PM5 are also turned off. Voltage V3 at the drain of NMOS transistor NM2 is pulled to ground or voltage VSS at the source of NMOS transistor NM2. Voltage V3 is also at the gate of NMOS transistor N3. Transistor N3 is therefore turned off. At the same time, PMOS transistor P6 is configured to be on, which pulls output SA_OUT300 at the drain of PMOS transistor P6 to voltage VDD at the source of PMOS transistor P6.

In contrast, when the resistance of fuse eFuse is less than the resistance of resistor Rref, voltage V2 is less than voltage V1. As a result, transistor NM1 is turned on and transistor NM2 is turned off. PMOS transistors PM4 and PM5 are also turned on. Consequently, voltage V3 at the drain of PMOS transistor PM5 is pulled to voltage VDD at the source of PMOS transistor PM5. Voltage V3 is also at the gate of NMOS transistor N3. Transistor N3 is therefore turned on. At the same time, PMOS transistor P6 is configured to be off. As a result, output SA_OUT300 at the drain of NMOS transistor N3 is pulled to ground or voltage VSS at the source of NMOS transistor N3. Effectively, when fuse eFuse is programmed and has a high logical value, output SA_OUT300 is logically high. Bur if fuse eFuse is not programmed and has a low logical value, output SA_OUT300 is logically low.

Exemplary Method

Figure 4:
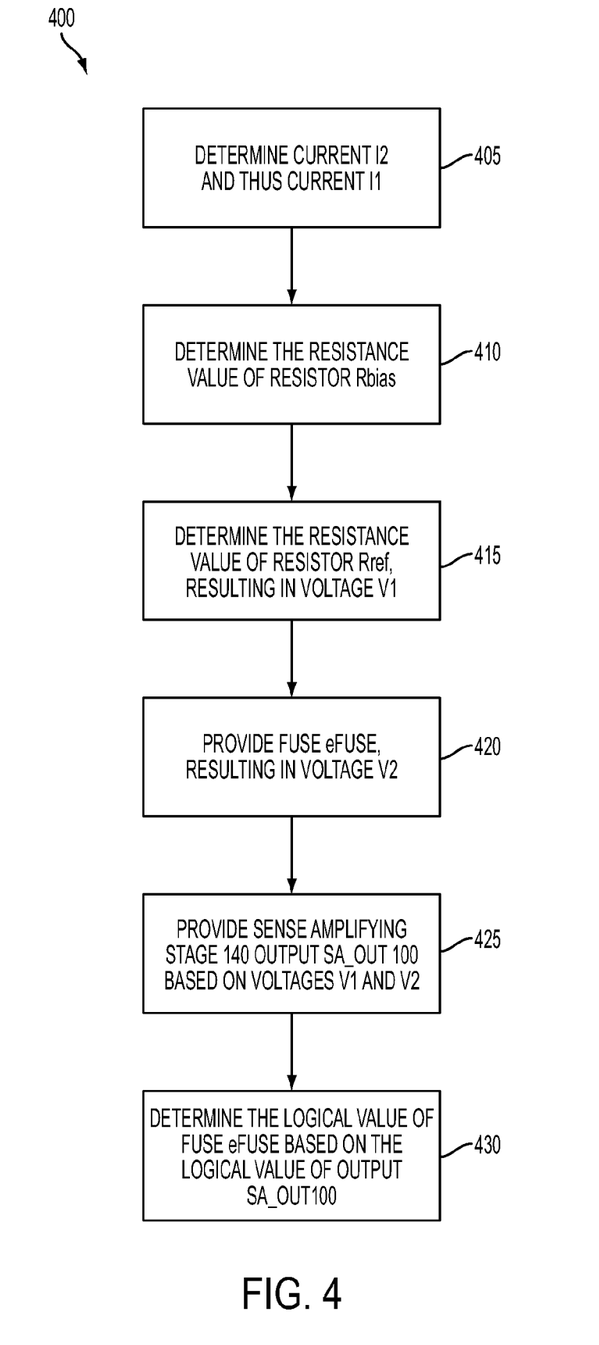
FIG. 4 is a flowchart of a method illustrating a configuration and operation of the sense amplifier circuit in FIG. 1, in accordance with some embodiments.

FIG. 4 is a flowchart of a method 400 illustrating an operation of sense amplifying circuit 100 in the normal mode, in accordance with some embodiments.

In operation 405, a desired current I2 and thus current I1 are determined. In some embodiments, current I2 is determined such that the absolute value of voltage V1 is less than the absolute value of the threshold voltage of PMOS transistor P4. In some embodiments, current I2 is selected to be 0.5 mA for the normal mode.

In operation 410, the resistance value for resistor Rbias corresponding to current I2 or current I1 is selected. The resistance value is based on the relationship between resistor Rbias, voltage VDP1, voltage VGP1, voltage VGSP1, voltage VDSP1, the I-V curve of transistor P1, as illustratively shown above with reference to equations (1), (2), (3), (4), and (5). In some embodiments, the resistance of resistor Rbias is 1 KΩ. In some other embodiments, the resistance of resistor Rbias is 0.5 KΩ.

In operation 415, the resistance value for reference resistor Rref is selected, resulting in reference voltage V1. In some embodiments, the resistance for resistor Rref is 1 KΩ. The resistance of resistor Rref is selected to determine the logical value of fuse eFuse. In other words, the resistance of resistor Rref is determined based on whether fuse eFuse is logically high or logically low. In various embodiments, the resistance of fuse eFuse for both the logical high value and the logical value is known to fall within a predetermined range. The predetermined range is used to select the resistance of resistor Rref.

In operation 420, fuse eFuse having the logical value to be measured is provided to sense amplifying circuit 100, resulting in voltage V2.

In operation 425, sense amplifying stage 140, based on the difference between voltages V2 and V1, provides a logical value to output SA_OUT100.

In operation 430, determining the logical value of output SA_OUT100 reveals the logical value of fuse eFuse. For example, if output SA_OUT100 is logically high, fuse eFuse is logically high and has been programmed. In contrast, if output SA_OUT100 is logically low, fuse eFuse is logically low and has not been programmed.

Various embodiments are advantageous because once the resistance value for reference resistor Rref is selected to determine the logical value of fuse eFuse, current I2 is adjustable by adjusting current I1 based on the resistance value of bias resistor Rbias. In contrast, in some previous approaches, once the resistance value of the reference resistor corresponding to resistor Rref is selected, the reference current flowing through the reference resistor is not adjustable. In other words, in some previous approaches, if the reference current is to be changed, the resistance of reference resistor is also to be changed, which is not desirable.

Because current I2 is adjustable, voltage V1 is adjustable. Effectively, voltages V1 and V2 at the differential inputs of sense amplifying stage 140 are adjustable and are thus tuned to the voltage levels optimal to sense amplifying stage 140. Further, sense amplifying stage 140 is designed to differentiate a small voltage difference between voltages V1 and V2. As a result, with a small difference between voltages V1 and V2, sense amplifying stage 140 is able to provide a corresponding logical value for output SA_OUT100. Effectively, sense amplifying stage 140 or sense amplifying circuit 100 can differentiate a small resistance difference between the resistance of reference resistor Rref and of fuse eFuse. In contrast, in various existing approaches, a sense amplifier requires to have a large resistance difference between the reference resistor corresponding to resistor Rref and fuse eFuse before the sense amplifier can provide a corresponding logical value at the output of the sense amplifier.

The above illustration is explained with reference to circuit 100. The operations of circuit 200 and 300 are similar and should be recognizable by persons of ordinary skill in the art.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic value of various signals used in the above description is also for illustration. Various embodiments are not limited to a particular value when a signal is activated and/or deactivated. Selecting different values is within the scope of various embodiments. For example, other types of transistors and/or circuits generating voltages V1 and V2 are within the scope of various embodiments. Other sense amplifying circuits used in place of sense amplifying stages 140 and 340 are within the scope of various embodiments. Various figures show discrete resistors for illustration. Equivalent circuitry may be used. For example, a resistive device, circuitry or network, such as a combination of resistors, resistive devices, circuitry, etc., can be used in place of a resistor.

In some embodiments, an amplifying circuit comprises a bias circuit, a reference circuit, a first circuit, and an amplifying sub-circuit. The bias circuit is configured to provide a bias current. The reference circuit is configured to provide a first differential input based on a reference resistive device and a reference current derived from the bias current. The first circuit is configured to provide a second differential input based on a first current and a first resistance. The amplifying sub-circuit is configured to receive the first differential input and the second differential input and to generate a sense amplifying output indicative of a resistance relationship between the first resistance and a resistance of the reference resistive device.

In some embodiments, a method is used to determine a resistance relationship between a resistance of a reference resistive device and a resistance of a first resistive device. In the method, a first current is generated. The first current is mirrored to generate a second current flowing through the reference resistive device, thereby generating a first differential input signal based on the second current and the resistance of the reference resistive device. A second differential input signal is generated based on a third current and the resistance of the first resistive device. An output signal is generated to indicate the relationship between the resistance of the reference resistive device and the resistance of the first resistive device, based on a voltage difference between the first differential input signal and the second differential input signal.

In some embodiments, a circuit comprises a first transistor, a bias resistive device, a second transistor, a reference resistive device, a third transistor, a first resistive device, and an amplifying sub-circuit. A first terminal of the first transistor is coupled to a second terminal of the first transistor and a first end of the bias resistive device. A first terminal of the second transistor is coupled to a first end of the reference resistive device and is configured as a first differential input. A second terminal of the second transistor is coupled to the second terminal of the first transistor. A first terminal of the third transistor is coupled to a first end of the first resistive device and is configured as a second differential input. A second terminal of the third transistor is coupled to the second terminal of the second transistor. The amplifying sub-circuit is configured to receive the first differential input and the second differential input and to generate an amplifying output carrying a signal indicating a voltage relationship between the first differential input and the second differential input, thereby indicating a resistance relationship between a resistance of the reference resistive device and a resistance of the first resistive device.

In some embodiments, a method is used to determine a resistance relationship between a resistance of a reference resistive device and a resistance of a first resistive device. In the method, a first voltage is a generated based on the resistance of the reference resistive device. A second voltage is generated based on the resistance of the first resistive device. A signal indicating the resistance relationship between the resistance of the reference resistive device and the resistance of the first resistive device is generated based on a relationship between the first voltage and the second voltage. A first current, a second current flowing through the reference resistive device, and a third current flowing through the first resistive device are equal. The second current is derived from the first current.

The above illustration includes exemplary steps, but the steps are not necessarily performed in the order shown. Steps may be added, replaced, changed order, and/or eliminated as appropriate, in accordance with the spirit and scope of disclosed embodiments.

What is claimed is:

1. An amplifying circuit comprising:
   a bias circuit configured to provide a bias current;
   a reference circuit configured to provide a first differential input based on a reference resistive device and a reference current derived from the bias current;
   a first circuit configured to provide a second differential input based on a first current and a first resistance; and
   an amplifying sub-circuit configured to receive the first differential input and the second differential input and to generate a sense amplifying output indicative of a resistance relationship between the first resistance and a resistance of the reference resistive device.

2. The amplifying circuit of claim 1, wherein
   the bias circuit and the reference circuit are configured such that the reference current equals the bias current; and
   the first circuit is configured to generate the first current equaling the reference current.

3. The amplifying circuit of claim 1, wherein
the bias circuit comprises a first transistor;
a first terminal of the first transistor is coupled to a second terminal of the first transistor and to a first end of the bias resistive device;
the reference circuit comprises a second transistor;
a first terminal of the second transistor is coupled to a first end of the reference resistive device and is configured as the first differential input;
a second terminal of the second transistor is coupled to the second terminal of the first transistor;
the first circuit comprises a third transistor;
a first terminal of the third transistor is coupled to a first end of the first resistive device and is configured to serve as the second differential input; and
a second terminal of the third transistor is coupled to the second terminal of the second transistor.

4. The amplifying circuit of claim 1, wherein
the first transistor, the second transistor, and the third transistors are each PMOS transistors; or
the first transistor, the second transistor, and the third transistors are each NMOS transistors.

5. The amplifying circuit of claim 1, wherein
a transistor of the bias circuit and a transistor of the reference circuit are configured to form a current mirror mirroring the bias current to the reference current.

6. The amplifying circuit of claim 1, wherein the amplifying sub-circuit comprises:
a first stage configured to receive the first differential input and the second differential input; and
a second stage configured to receive an output of the first stage and generate the sense amplifying output.

7. The amplifying circuit of claim 6, wherein
the first stage comprises a first transistor, a second transistor, a third transistor, and a fourth transistor;
a first terminal of the first transistor is coupled to a first terminal of the third transistor, a second terminal of the third transistor, and a second terminal of the fourth transistor;
a second terminal of the first transistor is configured to receive the first differential input signal;
a first terminal of the second transistor is coupled to a first terminal of the fourth transistor;
a second terminal of the second transistor is configured to receive the second differential input signal;
the second stage comprises a fifth transistor and a sixth transistor;
a first terminal of the fifth transistor is coupled to a first terminal of the sixth transistor, and is configured to carry the output signal; and
a second terminal of the sixth transistor is coupled to the first terminal of the fourth transistor.

8. The amplifying circuit of claim 7, wherein
the first transistor and the second transistor are each PMOS transistors and the third transistor and the fourth transistor are each NMOS transistors; or
the first transistor and the second transistor are each NMOS transistors and the third transistor and the fourth transistor are each PMOS transistors.

9. The amplifying circuit of claim 1, wherein the first resistive device is an electrical fuse.

10. A method to determine a resistance relationship between a resistance of a reference resistive device and a resistance of a first resistive device, the method comprising:
generating a first current;
based on the first current, generating a second current flowing through the reference resistive device, thereby generating a first differential input signal based on the second current and the resistance of the reference resistive device;
generating a second differential input signal based on a third current and the resistance of the first resistive device; and
generating an output signal indicating the relationship between the resistance of the reference resistive device and the resistance of the first resistive device, based on a voltage difference between the first differential input signal and the second differential input signal.

11. The method of claim 10, wherein
the first current is a current of a first transistor;
the second current is a current of a second transistor; and
the first transistor and the second transistor form a current mirror mirroring the first current to the second current.

12. The method of claim 10, wherein
the first current is a current of a first transistor;
the second current is a current of a second transistor;
a first terminal of the first transistor is coupled to a second terminal of the first transistor and a second terminal of the second transistor; and
a first terminal of the second transistor is coupled to a first end of the reference resistive device and configured to carry the first differential input signal, the second current flowing through the reference resistive device.

13. The method of claim 12, wherein
the second terminal of the first transistor is further coupled to a first end of a bias resistive device, the first current flowing through the bias resistive device.

14. The method of claim 10, wherein generating the output signal comprises using an amplifying sub-circuit that comprises
a first stage configured to receive the first differential input and the second differential input; and
a second stage configured to receive an output of the first stage and generate the output signal.

15. The method of claim 10, wherein the first resistive device is an electrical fuse.

16. An amplifying circuit comprising:
a first transistor;
a bias resistive device;
a second transistor;
a reference resistive device;
a third transistor;
a first resistive device; and
an amplifying sub-circuit,
wherein
a first terminal of the first transistor is coupled to a second terminal of the first transistor and a first end of the bias resistive device;
a first terminal of the second transistor is coupled to a first end of the reference resistive device and is configured to serve as a first differential input, a second terminal of the second transistor is coupled to the second terminal of the first transistor;
a first terminal of the third transistor is coupled to a first end of the first resistive device and is configured as a second differential input, a second terminal of the third transistor is coupled to the second terminal of the second transistor; and
the amplifying sub-circuit is configured to receive the first differential input and the second differential input and to generate an amplifying output carrying a signal indicating a voltage relationship between the first differential input and the second differential input, thereby indicating a resistance relationship between a resistance of the reference resistive device and a resistance of the first resistive device.

17. The circuit of claim 16, wherein the amplifying sub-circuit comprises
a first stage configured to receive the first differential input and the second differential input; and
a second stage configured to receive an output of the first stage and generate the amplifying output.

18. The circuit of claim 16, wherein
the amplifying sub-circuit comprises a fourth transistor, a fifth, a sixth transistor, a seventh transistor, an eighth transistor, and a ninth transistor;
a first terminal of the fourth transistor is coupled to a first terminal of the sixth transistor, a second terminal of the sixth transistor and a second terminal of the seventh transistor;
a second terminal of the fourth transistor is configured to receive the first differential input signal;
a first terminal of the fifth transistor is coupled to a first terminal of the seventh transistor;
a second terminal of the fifth transistor is configured to receive the second differential input signal;
a first terminal of the eighth transistor is coupled to a first terminal of the ninth transistor, and is configured to carry the output signal; and
a second terminal of the ninth transistor is coupled to the first terminal of the seventh transistor.

19. The circuit of claim 18, wherein
the first transistor, the second transistor, the third transistor, the fourth transistor the fifth transistor, and the eighth transistor are each PMOS transistors, and the sixth transistor, the seventh transistor, and the ninth transistor are each NMOS transistors; or
the first transistor, the second transistor, the third transistor, the sixth transistor, the seventh transistor, and the ninth transistor are each NMOS transistors and the fourth transistor, the fifth transistor, and the eighth transistor are each PMOS transistors; or
the first transistor, the second transistor, the third transistor, the sixth transistor, the seventh transistor, and the eighth transistors are each PMOS transistors, and the fourth transistor, the fifth transistor, and the ninth transistor are each NMOS transistors.

20. The circuit of claim 16, wherein
the first resistive device is an electrical fuse.

21. A method to determine a resistance relationship between a resistance of a reference resistive device and a resistance of a first resistive device, the method comprising:
generating a first voltage based on the resistance of the reference resistive device;
generating a second voltage based on the resistance of the first resistive device; and
generating a signal indicating the resistance relationship between the resistance of the reference resistive device and the resistance of the first resistive device, based on a relationship between the first voltage and the second voltage,
wherein
a first current, a second current flowing through the reference resistive device, and a third current flowing through the first resistive device are equal; and
the second current is derived from the first current.

* * * * *